(12) United States Patent
Ban et al.

(10) Patent No.: US 7,859,028 B2
(45) Date of Patent: Dec. 28, 2010

(54) INDEPENDENTLY CONTROLLED, DOUBLE GATE NANOWIRE MEMORY CELL WITH SELF-ALIGNED CONTACTS

(75) Inventors: Ibrahim Ban, Beaverton, OR (US); Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/378,205

(22) Filed: Feb. 11, 2009

(65) Prior Publication Data

US 2009/0146208 A1      Jun. 11, 2009

(51) Int. Cl.
  *H01L 27/148*   (2006.01)
  *H01L 29/66*    (2006.01)
  *H01L 29/78*    (2006.01)
(52) U.S. Cl. .................. 257/249; 257/319; 257/331; 257/366
(58) Field of Classification Search .............. None
See application file for complete search history.

(56) References Cited

U.S. PATENT DOCUMENTS

| 5,798,548 | A  | * | 8/1998 | Fujiwara ................. 257/319 |
| 6,901,006 | B1 | * | 5/2005 | Kobayashi et al. ..... 365/185.01 |
| 7,045,854 | B2 | * | 5/2006 | Osabe et al. ............ 257/317 |
| 7,095,076 | B1 | * | 8/2006 | Han et al. ............... 257/319 |
| 7,339,232 | B2 | * | 3/2008 | Seo et al. ................ 257/319 |
| 7,545,001 | B2 | * | 6/2009 | Cheng et al. ............ 257/357 |
| 2002/0022325 | A1 | * | 2/2002 | Gardner et al. .......... 438/287 |
| 2003/0112659 | A1 | * | 6/2003 | Ohsawa .................. 365/174 |
| 2005/0093064 | A1 | * | 5/2005 | Ohsawa .................. 257/347 |

* cited by examiner

*Primary Examiner*—David E Graybill
(74) *Attorney, Agent, or Firm*—Blakely, Sokoloff, Taylor & Zafman LLP (57) ABSTRACT

A double gate, dynamic storage device and method of fabrication are disclosed. A back (bias gate) surrounds three sides of a semiconductor body with a front gate disposed on the remaining surface. Two different gate insulators and gate materials may be used.

6 Claims, 11 Drawing Sheets

INDEPENDENTLY CONTROLLED, DOUBLE GATE NANOWIRE MEMORY CELL WITH SELF-ALIGNED CONTACTS

REFERENCE TO RELATED APPLICATION

This application claims priority to U.S. application Ser. No. 11/321,147, filed Dec. 28, 2005.

FIELD OF THE INVENTION

This invention relates to the field of dynamic, random-access memories (DRAMs), and devices with double gates, particularly those using transistors with floating bodies.

PRIOR ART AND RELATED ART

Most common DRAM cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The silicon substrate is used as the back gate, and consequently, must be biased relative to the silicon layer. Unfortunately, the oxide layer is relatively thick, requiring a relatively high voltage (e.g., 100 volts) for the bias.

Several structures have been proposed to reduce this relatively high bias potential, including use of a double gate floating body and silicon pillars. These structures are difficult to fabricate. This and other related technology is described at C. Kuo, *IEDM*, December 2002, following M. Chan Electron Device Letters, January 1994; C. Kuo, *IEDM*, December 2002, "*A Hypothetical Construction of the Double Gate Floating Body Cell;*" T. Ohsawa, et al., *IEEE Journal of Solid-State Circuits*, Vol. 37, No. 11, November 2002; and David M. Fried, et al., "*Improved Independent Gate N-Type FinFET Fabrication and Characterization,*" *IEEE Electron Device Letters*, Vol. 24, No. 9, September 2003; *Highly Scalable FBC with 25 nm BOX Structure for Embedded DRAM Applications*, T. Shino, IDEM 2004, pgs 265-268; T. Shino, IEDM 2004, "*Fully-Depleted FBC (Floating Body Cell) with enlarged signal Window and excellent Logic Process Compatibility;*" T. Tanaka, IEDM 2004, "*Scalability Study on a Capacitorless 1 T-DRAM: From Single-gate PD-SOI to Double-gate FinDRAM*; and U.S. Patent Application 2005/0224878.

DETAILED DESCRIPTION

In the following description, a memory and method for fabricating the memory is described. Numerous specific details are set forth, such as specific conductivity types, and metalization arrangements, to provide a thorough understanding of the present invention. It will be apparent to one skilled in the art, that the present invention may be practiced without these specific details. In other instances, well known processing steps and circuits have not been described in detail, in order not to unnecessarily obscure the present invention.

Figure 1:
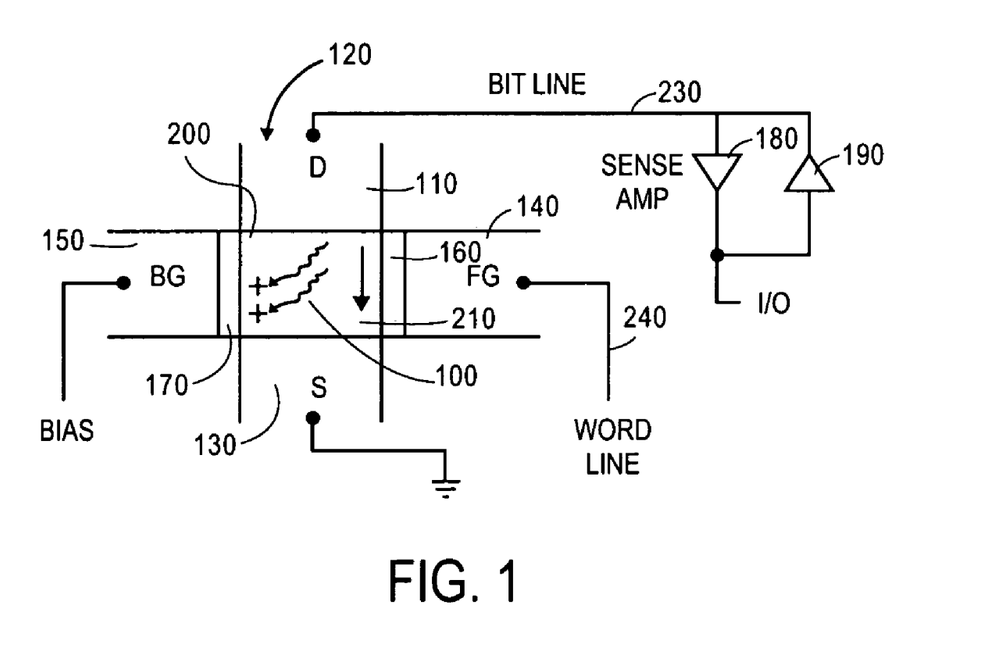
FIG. 1 is a plan view of a memory cell and its connection to the peripheral circuits in a memory.

A single memory cell is shown in schematic form in FIG. 1. A portion of a semiconductor line or body 120, formed on an oxide layer (such as BOX 250 of FIG. 2), and etched from, for example, a monocrystalline silicon layer is illustrated. The body 120 includes a pair of spaced-apart, doped regions 110 and 130, disposed in first opposite sides of the body thereby defining a channel region 100. In one embodiment, the channel region is a p type region, and the source region 130 and drain region 110 are more heavily doped with an n type dopant.

Figure 2:
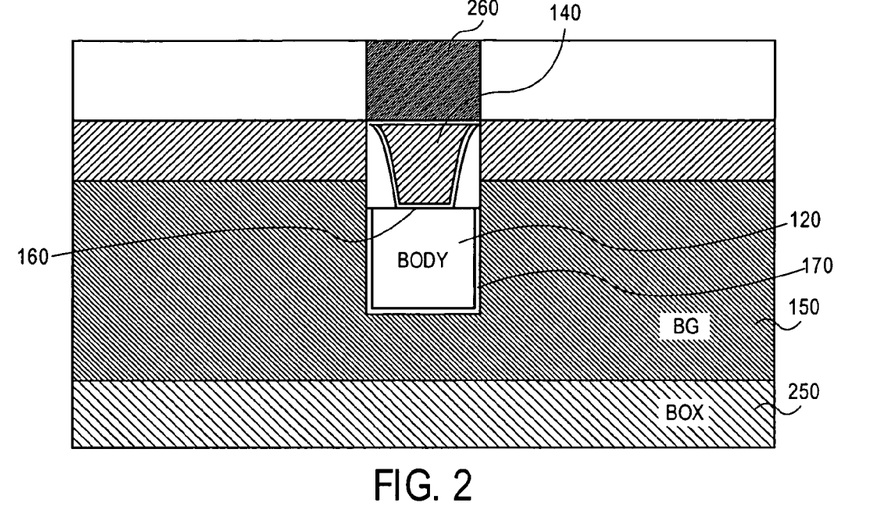
FIG. 2 is a cross-sectional, elevation view of a single memory cell.
Figure 3:
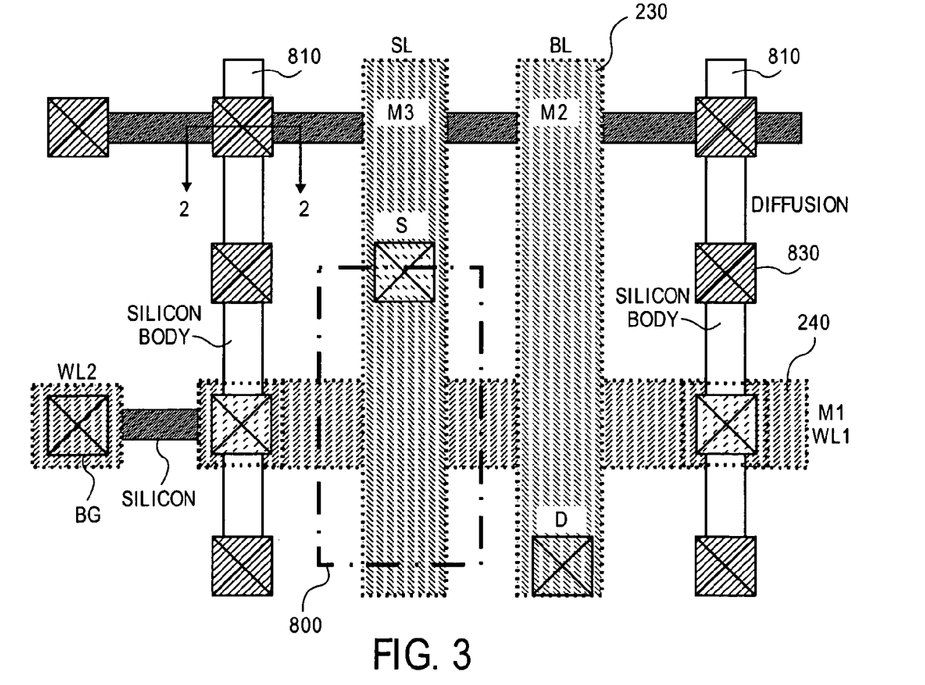
FIG. 3 is a plan view of a memory array used to illustrate metal lines and contacts to cells. Various metal layers have been striped away in FIG. 3 to assist in explaining the interconnect structure.

A pair of gates identified as a front gate 140 and back gate 150 are formed about the body 120, as will be discussed. The gates 140 and 150 are insulated from the channel region 100 of the silicon body 120 by the oxide layers 160 and 170, respectively. In FIG. 1 the gates are shown on opposite sides of the body to simplify the figure. A more accurate depiction of the cell is shown in FIG. 2. The back gate 150 surrounds the body 120 on its opposite sides and bottom. The front gate 140, with its nanowire contact 260, is formed above the body. The fabrication of the cell of FIG. 2 is described in FIGS. 4-20 below. The placement of the cells in an array of cells is shown in FIG. 3, with the single cell of FIG. 2 taken through section line 2-2 of FIG. 3. Other cells are present in FIG. 3 at the intersections of the vertical and horizontal lines.

The memory cell of FIG. 1 is a four-terminal device, coupled to the peripheral circuits of the memory. The cell is formed in an array of cells. For the n-channel embodiment illustrated, the source region is coupled to ground, and the back gate 150 is coupled to a source of bias, for example, −1 volt. The drain terminal 110 is connected to a bit line 230 in the memory. The front gate 140 is connected to a word line 240 in the memory to allow selection of the cell. The cell, as will be described, is a dynamic, random access memory cell, and as such, the data stored requires periodic refreshing.

Assume first, that the cell of FIG. 1 is not storing charge, and that the cell is selected by the application of a positive potential to a word line which is coupled to the gate 140. (A word line 240 is shown in FIG. 3, formed from a first level of metal.) Assume further, that a binary one is to be stored in (written into) the cell as represented by the storage of charge. (A binary 0 is represented by the absence of charge.) An amplifier 190 provides a positive potential to the bit line 230 causing conduction in the inversion channel 210 of the channel 100 of the body 120, as typically occurs in a field-effect transistor. As this occurs, hole pairs (resulting generally from impact ionization) drift towards the gate 150, under the influence of the bias applied to this gate. These holes remain in the storage 200 of the body region 120 after the potential is removed from the word line 240 and the potential is removed from the bit line 230.

Assume that it is necessary to determine whether the cell is storing a binary 1 or binary 0. The cell is selected by the application of a positive potential to the word line 230. The threshold voltage of the cell shifts, depending on whether holes are stored in the region 200. The cell has a lower threshold voltage, that is, it conducts more readily, when there is charge stored in the region 200. This shift in threshold voltage is sensed by the sense amplifier 180 and provides a reading of whether the cell is storing a binary 1 or binary 0. The reading be provided to an I/O output line, or to refresh circuitry to refresh the state of the cell.

The threshold voltage of the cell may be determined by comparing its threshold voltage to that of a reference cell in a cross-coupled sense amplifier. The threshold voltage of a reference cell may be established by, for example, having less charge or less bias on one of the memory cells used as a reference cell.

In one embodiment, the cell is fabricated on a BOX 250 which is formed on a silicon substrate not illustrated. Active devices for the memory are fabricated in, for instance, a monocrystalline silicon layer, disposed on the BOX 250. This SOI substrate is well-known in the semiconductor industry. By way of example, it is fabricated by bonding a silicon layer onto a substrate, and then, planarizing the silicon layer so that it is relatively thin. This relatively thin, low body effect layer, is used for active devices. Other techniques are known for forming the SOI substrate including, for instance, the implantation of oxygen into a silicon substrate to form a buried oxide layer.

The described processing below focuses on the fabrication of the cells in a memory array. While the array is fabricated on one section of the SOI substrate, the peripheral circuits for the memory may be fabricated on other sections of the SOI substrate.

In the processing for one embodiment, first a protective oxide is disposed on the silicon layer of the SOI substrate followed by the deposition of a silicon nitride layer. The silicon nitride is masked to define a plurality of spaced-apart, elongated, parallel lines and the underlying silicon layer is etched in alignment with these lines. The resultant structure is shown as part of FIG. 4, specifically a portion of one silicon line (body 120) disposed on the BOX 250.

Figure 4:
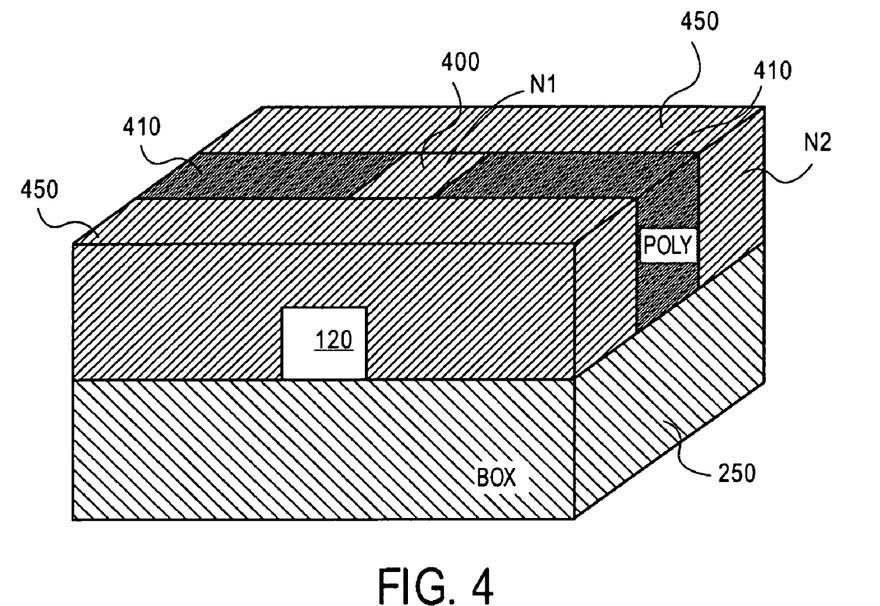
FIG. 4 is a perspective view of a semiconductor body formed on a buried oxide layer (BOX), this figures includes polysilicon spacers, a silicon nitride plug, and other carbon doped silicon nitride members.

A polysilicon layer is deposited over the structure and polished. A masking and etching process is used to define the spacer 410 as well as the plug 400. In this process, the nitride is removed from the body 120 except for the plug 400 which is protected by the mask. Consequently, as shown in FIG. 4, the spacers 410 have the same width as the plug 400. Next, another layer of silicon nitride 450, doped with carbon, in one embodiment, is deposited and polished such that it covers the exposed portions of the body 120, as well as opposite sides of the spacers 410 and plug 400. These silicon nitride members 450 shown in FIG. 4, are subsequently removed to permit ion implantation into the body 120 to define source and drain regions.

The silicon nitride layer from which the plug 400 is formed, is a typical high temperature, dense nitride layer. On the other hand, the layer from which the members 450 are formed is a carbon doped nitride with, for instance, 8-12% carbon. This latter nitride etches more slowly with a regular nitride etchant. As will be seen, this allows the removal of the plug 400 without substantially affecting the members 450.

Figure 5:
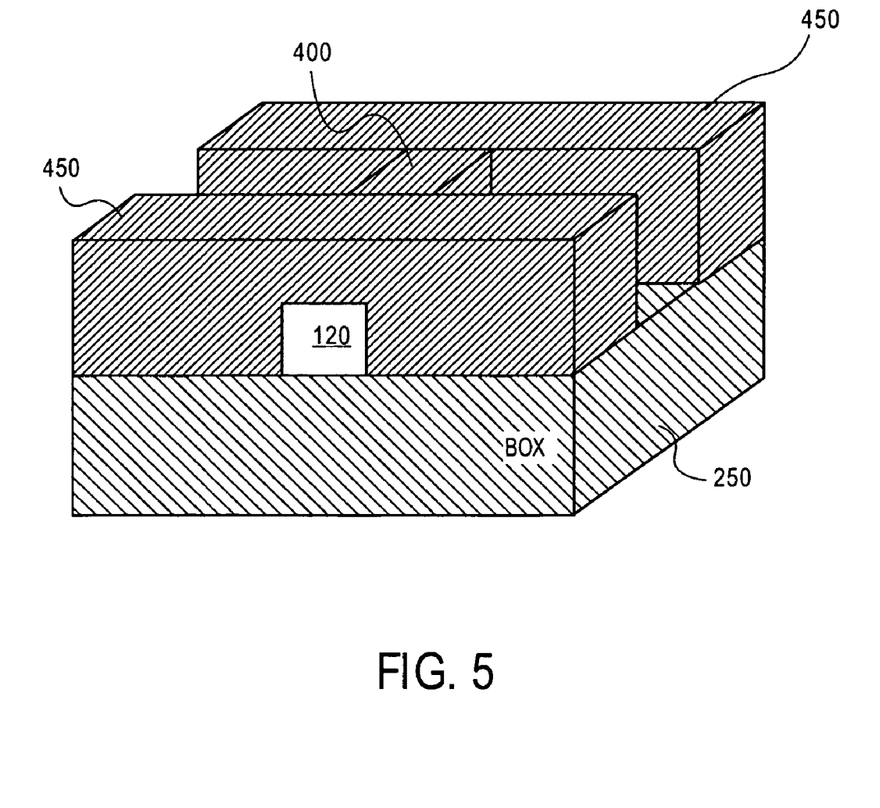
FIG. 5 illustrates the structure of FIG. 4 following the etching of the polysilicon spacers.

As shown in FIG. 5, the polysilicon spacers are removed with an ordinary wet etchant, leaving substantially untouched the plug 400 and members 450. This leaves an opening between the members 450 which is traversed by the plug 400.

Figure 6:
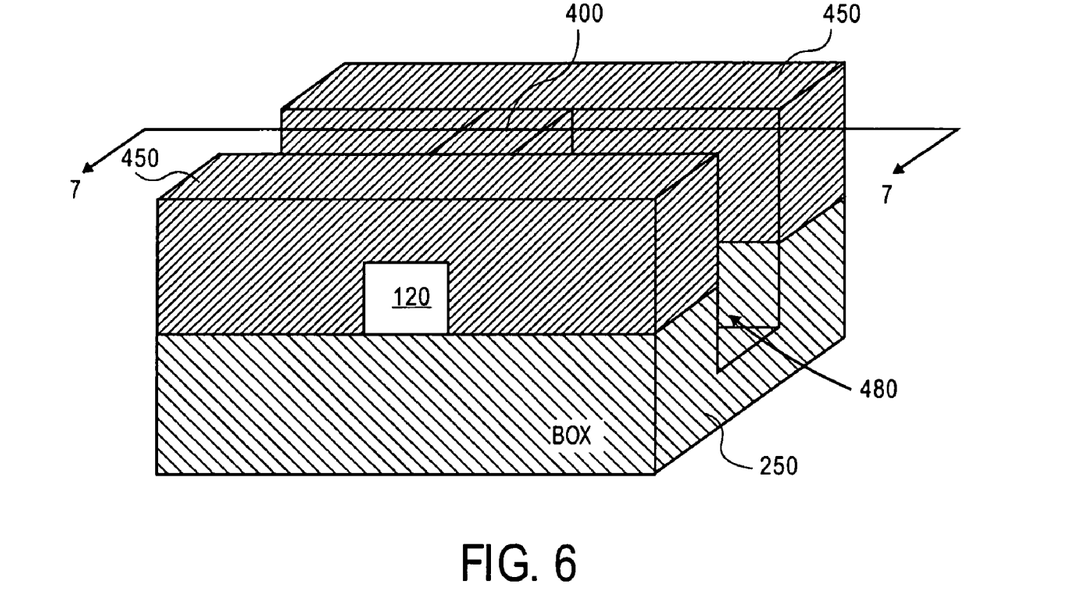
FIG. 6 illustrates the structure of FIG. 5, after dry etching used to etch the BOX.
Figure 7:
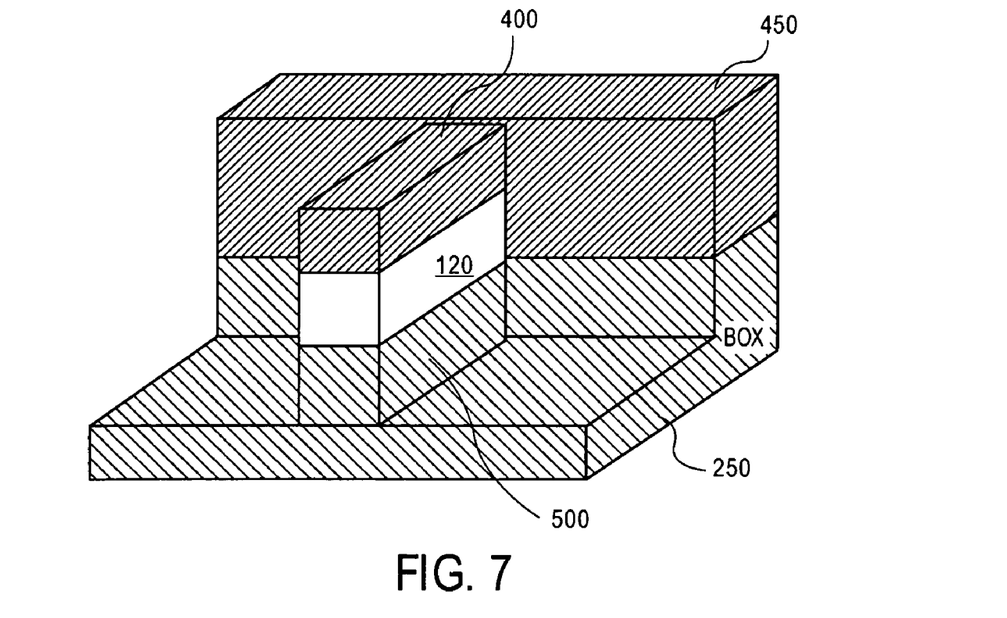
FIG. 7 is a cutaway view of the structure of FIG. 6 taken through section line 7-7 of FIG. 6.

A selective dry etching process is now used to recess the BOX 250. As illustrated in FIG. 6, the BOX 250 is etched, resulting in the formation of a trench 480, and leaving an oxide pedestal supporting the body 250. The resultant structure is best seen in FIG. 7, a cutaway view of FIG. 6 through section line 7-7 of FIG. 6. Note in FIG. 7, there remains a portion of BOX 250, a pedestal 500, under body 120.

Figure 8:
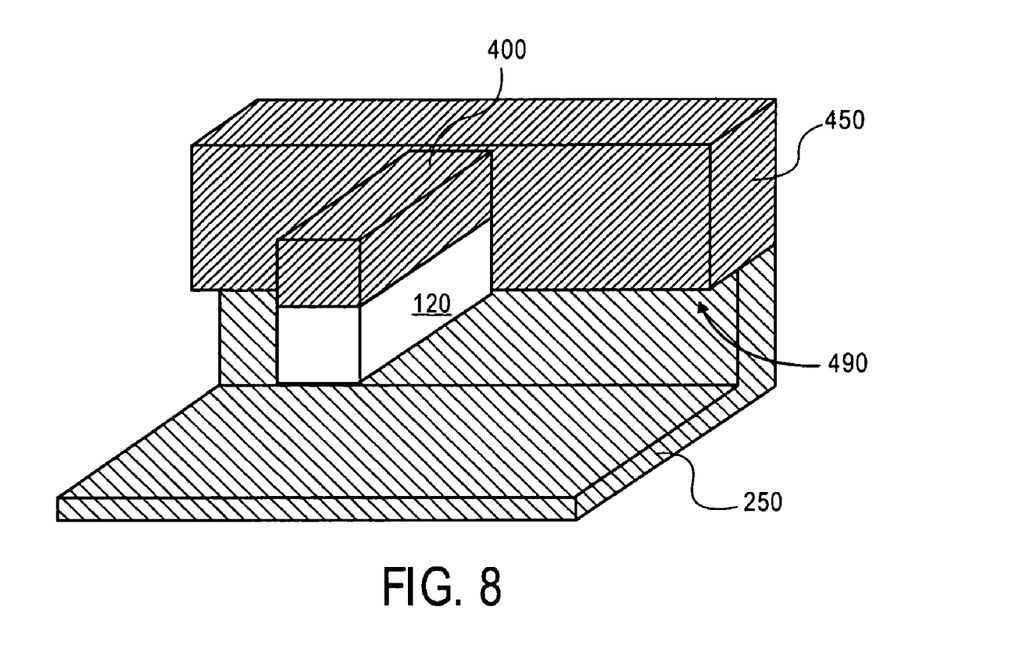
FIG. 8 illustrates the structure of FIG. 7, following wet etching used to remove the BOX under the semiconductor body.

Now, as best shown in FIG. 8, a wet oxide etchant, such as HF, is used to etch away the pedestal 500 of FIG. 7. This etching step also results in the undercutting of the members 450, as shown by the undercut 490, and further thinning of the BOX 250. While in FIG. 8 it appears that the body 120 is cantilevered from the member 450, recall that the body 120 is anchored at both ends in the members 450 and rests on the BOX 250 that remains under the members 450. Importantly, what has occurred as shown in FIG. 8, is the underside of the body 120 is now exposed in the channel region of the cell, permitting the formation of the back gate on three sides of the body 120. An oxide or other insulation is formed on the exposed portions of the body 120 so that the subsequently deposited gate silicon is insulated from the body 120. An ordinary wet or dry oxidation process may be used to grow 5-50 Å of oxide.

Figure 9:
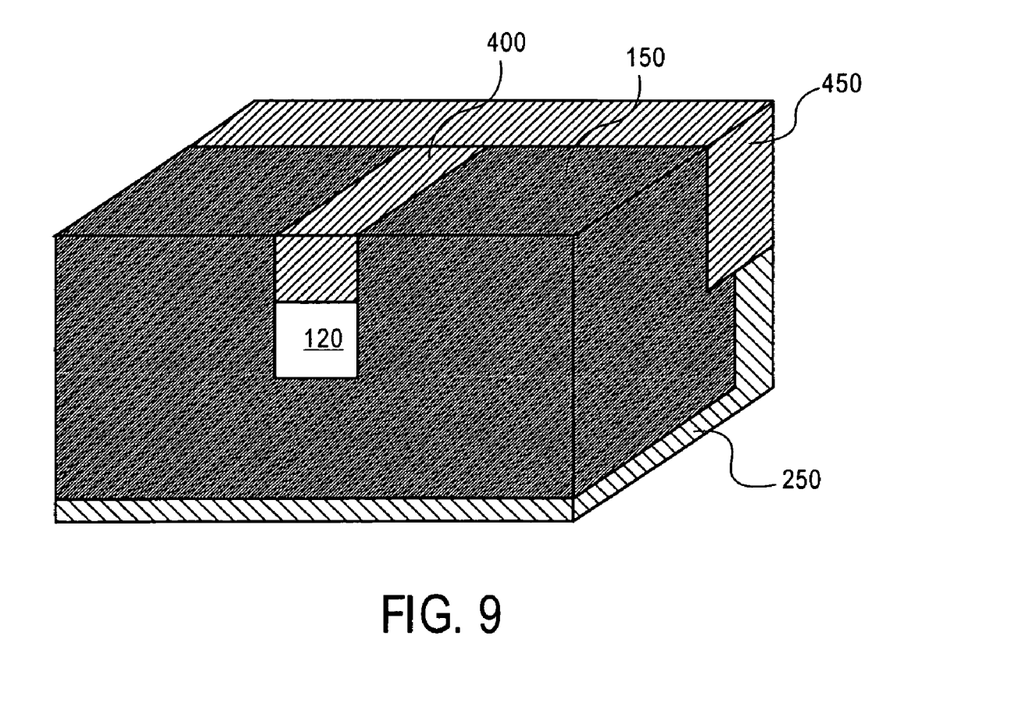
FIG. 9 illustrates the structure of FIG. 8, after the formation of a silicon layer.

Next, a low temperature, chemical vapor deposition (CVD) occurs for forming a silicon gate layer 150 both under the body 120 and along its sides where it is exposed. The silicon is, for the most part, more amorphous than a typical polysilicon to assure deposition under the body 120. A atomic layer deposition (ALD) may also be used for this deposition. A planarization step is used to planarized the silicon layer 150 so that it is level with the upper surfaces of the members 450, as shown in FIG. 9.

Figure 10:
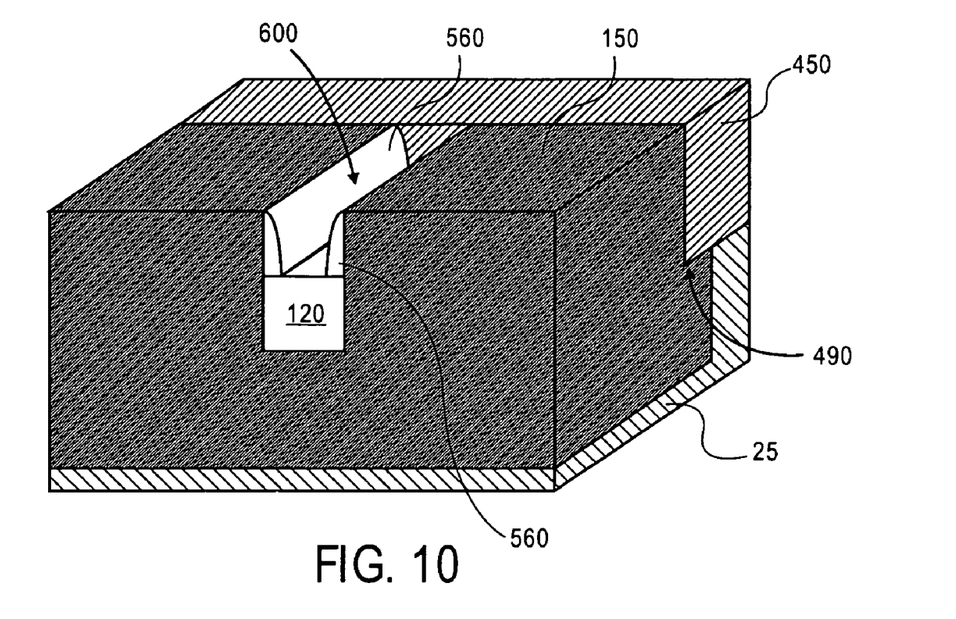
FIG. 10 illustrates the structure of FIG. 9, once spacers are etched from the silicon nitride plug.
Figure 11:
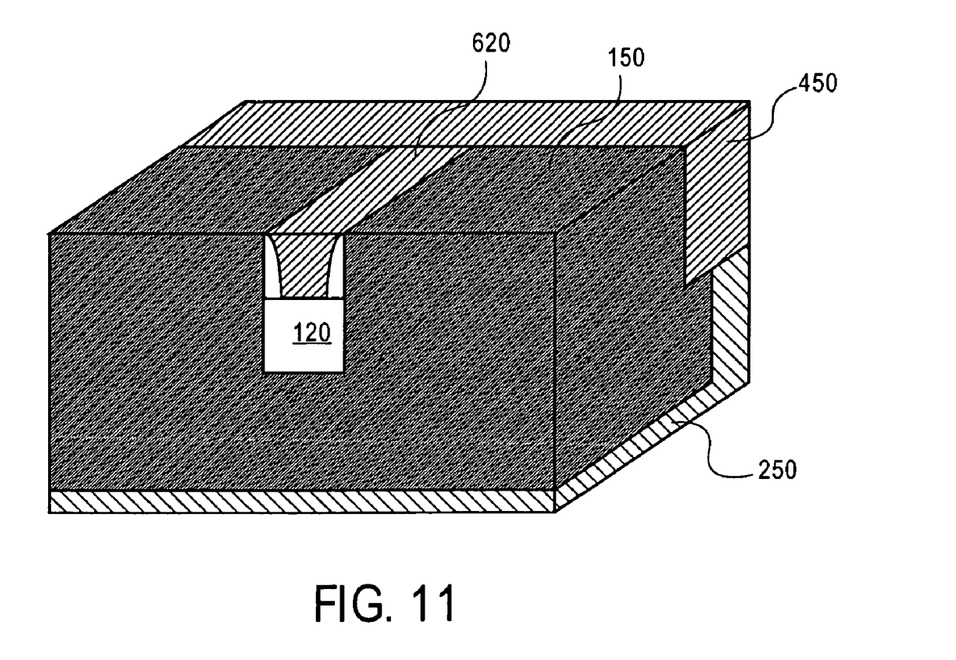
FIG. 11 illustrates the structure of FIG. 10, after a sacrificial oxide front gate is formed.

A silicon nitride etchant is now used to etch the plug 400. Then, a layer of silicon nitride or carbon doped silicon nitride is deposited. This layer fills the void created by the removal of the plug 400 as well covering the surface of the structure. A dry (anisotropic) etchant is used to form the spacers 560, and the opening 600 between the spacers 560, as seen in FIG. 10.

Very little of the members 450 are etched because of the relatively high amount of carbon in these members. This processing exposes the oxide layer on the upper surface of the body 120. The spacers 560 eventually provide insulation between the front gate and the back gate.

The opening 600 is now filled with an oxide 620 (FIG. 11) using an ordinary deposition and planarization step. The oxide 620, as will be seen, is a sacrificial gate, subsequently removed and replaced with a conductive gate material.

Figure 12:
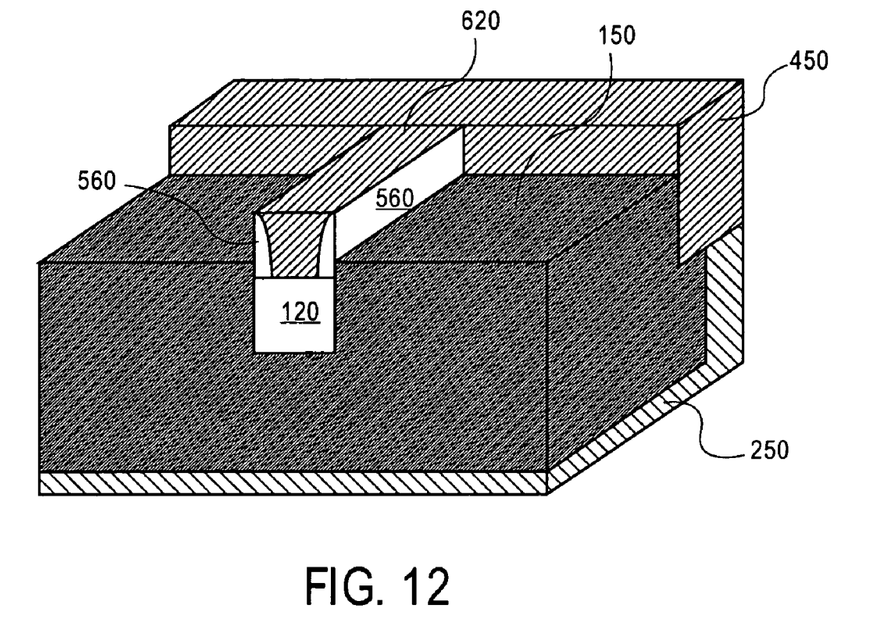
FIG. 12 illustrates the structure of FIG. 11, following the etching back of the silicon layer.

As shown in FIG. 12, the silicon gate layer 150 is etched such that the upper surface of layer 150 is below the upper surface of the oxide 620. This is done to assure that in subsequent processing a short does not occur between the front gate and back gate once the oxide 620 is replaced by the front gate.

Figure 13:
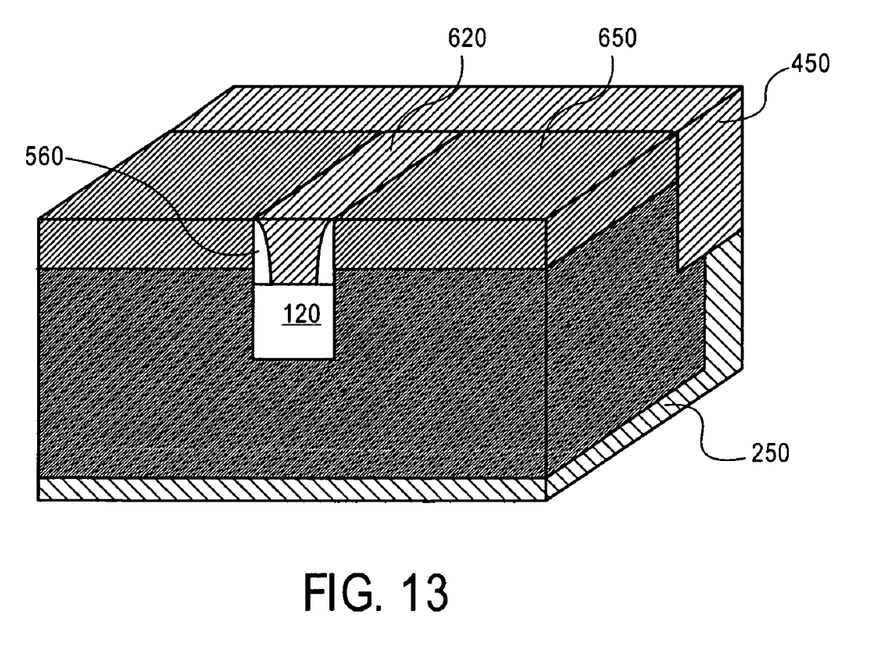
FIG. 13 illustrates the structure of FIG. 12, once a interlayer dielectric (ILD) is deposited.

A low k dielectric 650, such as a carbon-doped silicon dioxide, is formed over the structure of FIG. 12 and planarized to provide the layer 650 of FIG. 13 in one embodiment.

Figure 14:
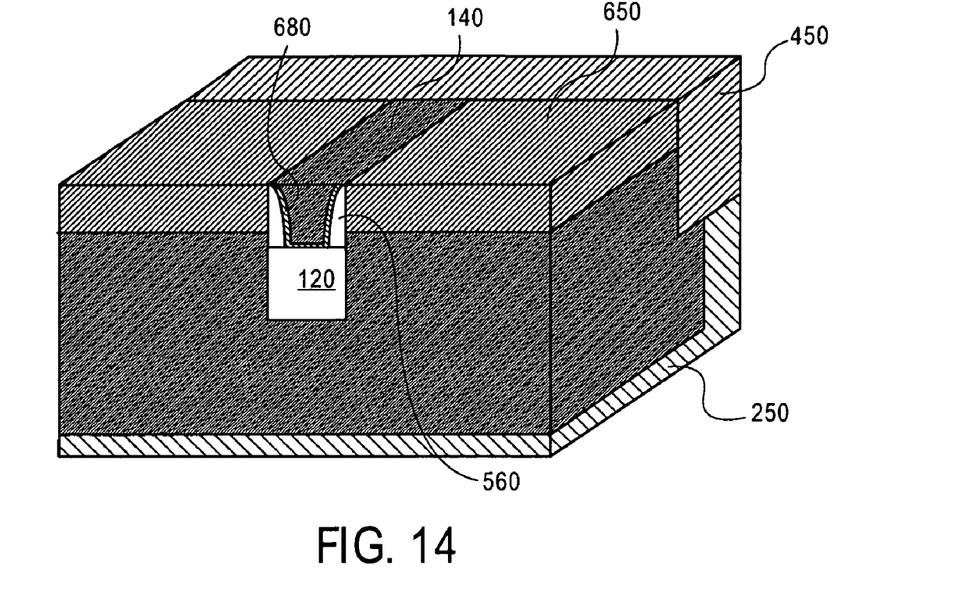
FIG. 14 illustrates the structure of FIG. 13, after the removal of the sacrificial gate and the fabrication of a front gate.

Next, an oxide etchant is used to remove the sacrificial gate oxide 620. This exposes the upper surface of the body 120 between the spacers 560. A gate oxide is formed on the exposed body 120, for instance by growing a silicon dioxide layer 680, shown in FIG. 14. Polysilicon is then deposited to form the front gate. CMP is used to etch back the polysilicon layer such that the front gate does not overlay the layer 650 or the spacers 450. The resultant structure is shown in FIG. 14. Rather than using a silicon dioxide insulation and polysilicon gate for the front gate, in another embodiment, a high k dielectric is formed along with the metal gate for the gate 140.

Figure 15:
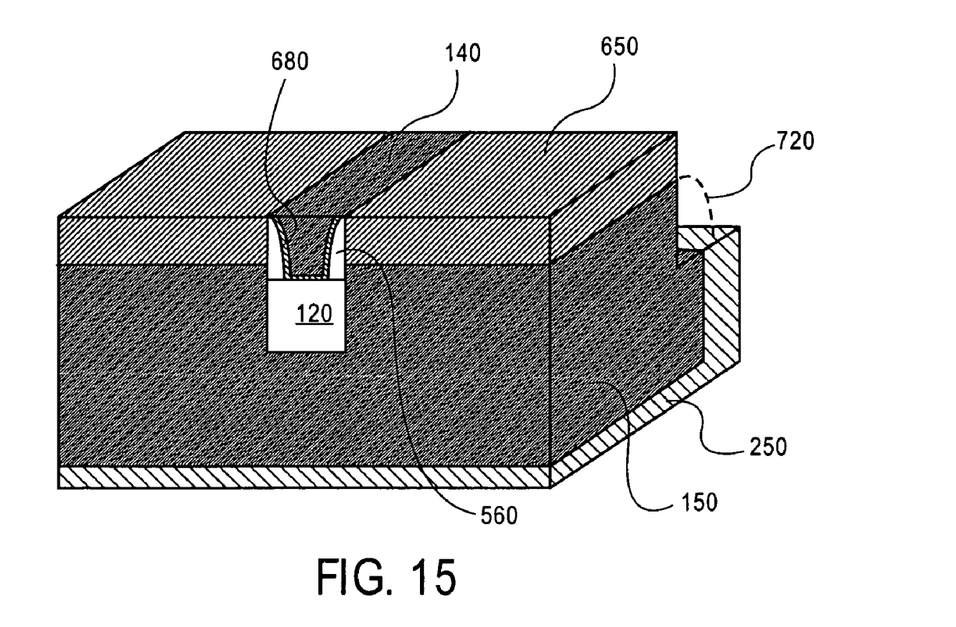
FIG. 15 illustrates the structure of FIG. 14, following the etching of the silicon nitride members, exposing a portion of the semiconductor body, for source and drain region implantation.

Now, as shown in FIG. 15, the members 450 are removed using a wet etchant such as hot phosphoric acid. Source and drain regions are then implanted into the exposed portions of the body 120. The formation of the source and drain regions may be done in two separate implantation steps: the first to form a tip or extension source and drain region, and the second for the main source and drain regions. This is done by implanting the tip regions after removal of the members 450, then forming spacers from another silicon nitride layer. These spacers are perpendicular to spacers 560; and edges of the one such a spacer is shown by the dotted line 720 of FIG. 15. The second ion implantation step forms the main source and drain regions in alignment with the spacers 720. For the described n channel device an n type dopant such as phosphorous or arsenic is used.

Figure 16:
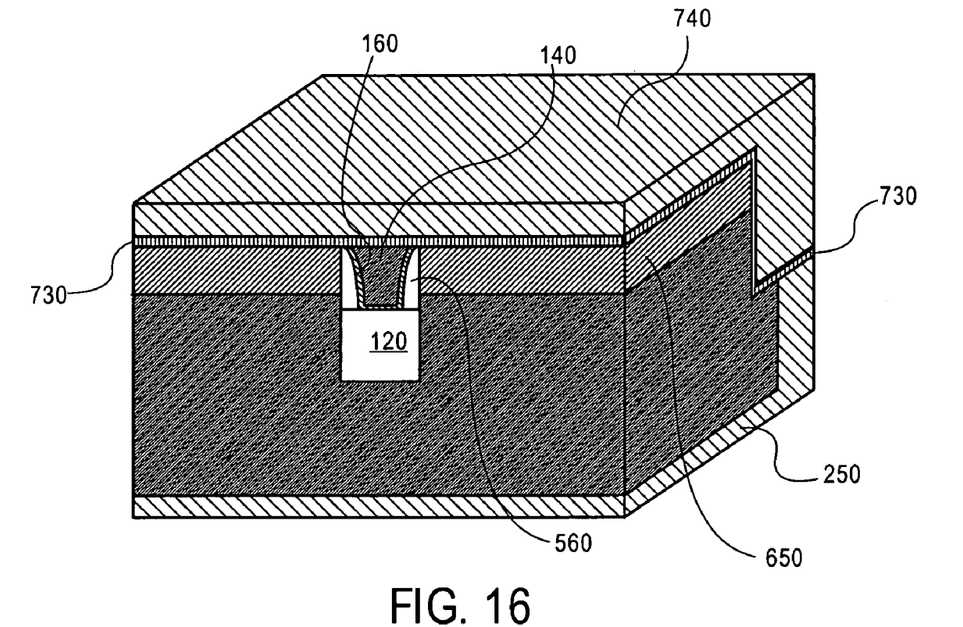
FIG. 16 illustrates the structure of FIG. 15, following the formation of etchant stop and dielectric layers.

Following the source and drain formation, as shown in FIG. 16, an etchant stop layer of oxide or nitride is formed. Then, an interlayer dielectric (ILD) 740 is deposited. The contacts to the underlying device now can be made.

Figure 17:
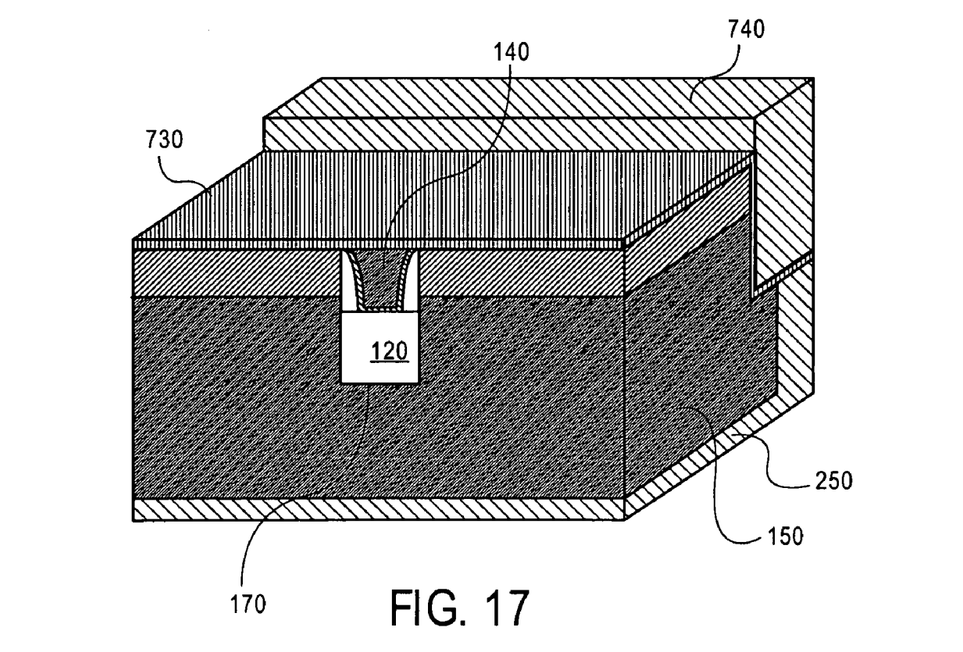
FIG. 17 illustrates the structure of FIG. 16, after the etching of the dielectric layer.

To this end, first a window is opened to expose the gate 140. This may be done with an ordinary photoresist mask which protects a portion of the layer 740 (see FIG. 17) allowing etching of the ILD 740 to expose the etchant stop layer 730. This window need not be aligned as shown in FIG. 17 with the gate, but rather may be larger, as shown.

Figure 18:
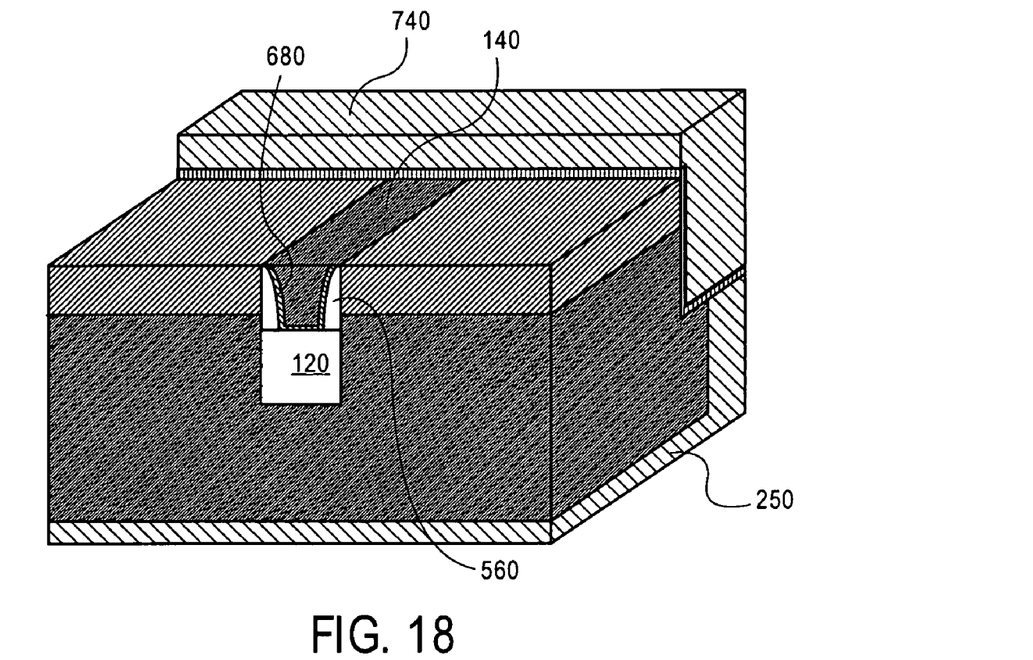
FIG. 18 illustrates the structure of FIG. 17, once the etchant stop layer is masked to reveal the front gate.

Next, as shown in FIG. 18, the etchant stop layer 730 is removed to expose the upper surface of the gate 700. At this point in the processing, in an alternate embodiment, a sacrificial gate could now be replaced with a high k dielectric and metal gate. This would be in lieu of forming the polysilicon gate 700 after the earlier removal of the oxide 620.

Figure 19:
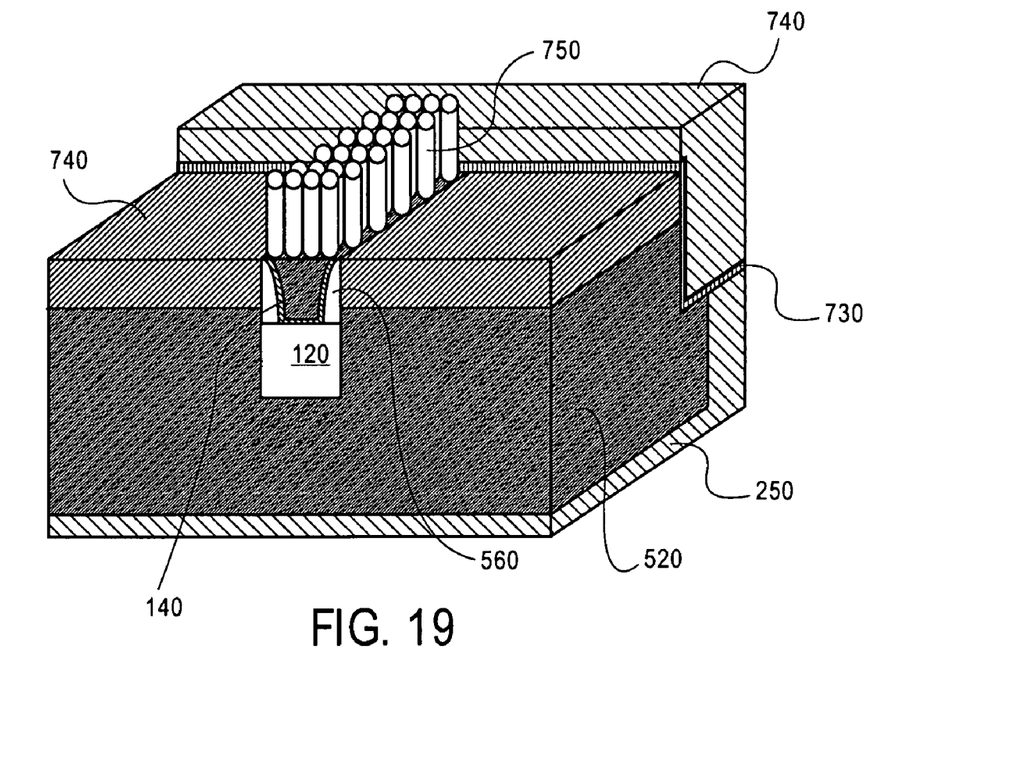
FIG. 19 illustrates the structure of FIG. 18, following the formation of nanowire contacts to the front gate.

As shown in FIG. 19, one method of forming the front gate contact is through self-aligned vertical growth of metal. Selective columnar growth of carbon nanotubes (CNT) on metallic surfaces may be used. Alternatively, instead of the CNT growth, conventional contact metallization steps could be used to complete the formation of a metal contact without there being any penalty on the cell area. The carbon nanotube contacts 750 are shown in FIG. 19.

A second contact lithography and dry etch is used to open up source/drain and a contact to back gate (silicon 520). This second lithography step can be done after contact is made to the front gate 700, or before contact is made to the front gate 700. The other contacts such as the source and drain regions and back gates are not shown in FIGS. 19 and 20. They are however, shown in FIG. 3 and will be discussed in conjunction with FIG. 3. Note the contact openings are not critically aligned since longer openings can be made for both source/drain and back gate contacts.

Figure 20:
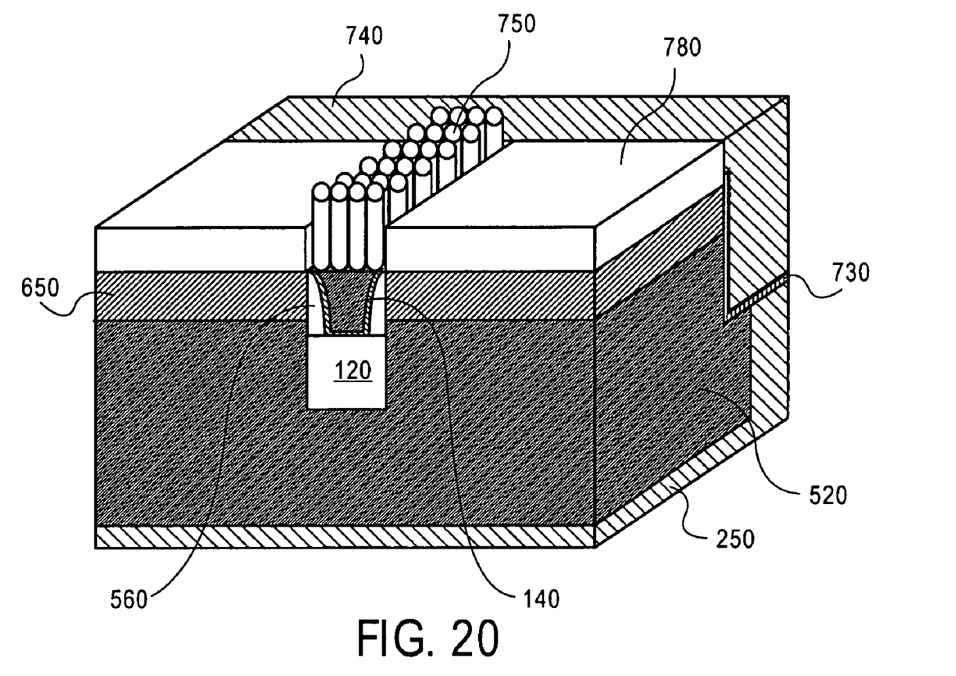
FIG. 20 illustrates the structure of FIG. 19, after the cell has been completed.

The completed device is shown in FIG. 20 after a low k ILD 780 is deposited. In an alternate embodiment, at this point in the processing, the second lithography step for contacts, mentioned earlier, could now be done to contact the source/drain regions and the back gate (silicon 520).

One connection arrangement for connecting the cell in an array is shown in FIG. 3. In FIG. 3 some of the layers are selectively shown to allow an explanation of the connection arrangement. One such cell is represented by the dashed, rectangular block 800. The source of the cell 800 is connected to a metal source line formed from a third layer of metallization (metal 3). In the adjacent line of the array, the drains of the devices are shown connected to a metal line 230 fabricated from the second level of metal. Line 230 is a bit lines in the array and used to sense the state a cell as well as write to the cell. It of course should be noted that there is a metal 2 bit line disposed beneath the metal 3 line formed over the cell 800 as well as over the other vertical lines of FIG. 3.

The word line 240 (WL1) is fabricated from the first level of metallization. This line is coupled to the front gates by, for instance, the nanotubes 750. The second word line WL2 is connected to the silicon 520 shown, for instance, in FIG. 20. None of the metal lines are not shown above diffusion lines 810 to reveal the source and drain diffusions. As can be seen, a single contact 830 to a source region, serves the source region of two cells and similarly, the drain contacts serve two adjacent cells. Other connection arrangements for connecting the contacts to the lines in the array may be used.

While as described above, polysilicon (for spacers 410), silicon nitride (for plug 400) and carbon doped silicon nitride (for members 450) were used, other combinations of material may be used for these sacrificial materials. Any three materials, where each of the materials may be selectively etched in the presence of the others may be used. Additionally, two of the materials should withstand the etching of the insulative layer (BOX 250) to allow exposure of the lower surface of the body.

Thus, a memory cell and memory have been described where a back gate surrounds three sides of a silicon body and a top gate is disposed over the remaining surface. By providing such complete gate coverage of the semiconductor body, improved performance including lower leakage, and more effective charge creation results. The low leakage provides a longer charge storage and consequently, longer times between refresh cycles are possible. The process also permits a different work function to be used for the front gate than is used for the back gate. Self-aligned contacts are provided throughout because of the processing. Additionally, the processing permits the selection of different gate dielectrics (both composition and thickness), thereby improving the low voltage operation as well as the reliability of the charge storage.

What is claimed is:

1. A semiconductor device comprising:
a semiconductor body having a top, sides and a bottom;
a first gate, insulated from the semiconductor body by a first gate insulator, disposed adjacent to the bottom and sides of the semiconductor body and extending above the top of the semiconductor body; and
a second gate, insulated by a second gate insulator from the semiconductor body, disposed adjacent to the top of the body, and isolated from the first gate.

2. The device of claim 1, wherein the first and second gate insulators are different materials.

3. The device of claim 2, wherein the first and second gates are different materials from one another.

4. The device of claim 3, wherein the second gate comprises metal.

5. The device of claim 1, wherein the first and second gates are isolated from one another by a pair of spacers.

6. The device of claim 1, wherein the second gate comprises metal, and wherein nanotubes are disposed on the second gate to define a gate contact.

* * * * *